United States Patent
Chen et al.

(10) Patent No.: US 11,839,024 B2
(45) Date of Patent: Dec. 5, 2023

(54) COMPOSITE AND COPPER CLAD LAMINATE MADE THEREFROM

(71) Applicant: DUPONT ELECTRONICS, INC., Wilmington, DE (US)

(72) Inventors: Yu-Cheng Chen, Hsinchu (TW); Mu-Huan Chi, Hsinchu (TW); Shih-Ching Lin, Hsinchu (TW); Wei-Guang Liu, Hsinchu (TW)

(73) Assignee: DUPONT ELECTRONICS, INC., Wilmington, DE (US)

( * ) Notice: Subject to any disclaimer, the term of this patent is extended or adjusted under 35 U.S.C. 154(b) by 0 days.

(21) Appl. No.: 17/326,870

(22) Filed: May 21, 2021

(65) Prior Publication Data

US 2022/0022314 A1 Jan. 20, 2022

Related U.S. Application Data

(60) Provisional application No. 63/052,049, filed on Jul. 15, 2020.

(51) Int. Cl.
*H05K 1/03* (2006.01)
*B32B 7/02* (2019.01)
(Continued)

(52) U.S. Cl.
CPC ............ *H05K 1/0366* (2013.01); *B32B 5/024* (2013.01); *B32B 7/12* (2013.01); *B32B 15/14* (2013.01); *B32B 15/20* (2013.01); *B32B 27/281* (2013.01); *B32B 27/34* (2013.01); *B32B 2260/021* (2013.01); *B32B 2260/046* (2013.01); *B32B 2262/101* (2013.01); *B32B 2270/00* (2013.01);
(Continued)

(58) Field of Classification Search
CPC .......... H05K 1/0366; H05K 2201/0338; B32B 15/20; B32B 7/12; B32B 5/024; B32B 15/14; B32B 27/281; B32B 27/34; B32B 2270/00; B32B 2307/714; B32B 2262/101; B32B 2457/08; B32B 2307/538; B32B 2260/046; B32B 2260/021; B32B 2307/20
See application file for complete search history.

(56) References Cited

U.S. PATENT DOCUMENTS 4,521,558 A 6/1985 Rockhill
5,861,076 A 1/1999 Edwin et al.
(Continued)

FOREIGN PATENT DOCUMENTS

EP 0251490 A2 4/1990
JP 2009185384 A * 8/2009
(Continued)

OTHER PUBLICATIONS

Machine translation of JP 2009-185384. (Year: 2009).*

*Primary Examiner* — John D Freeman

(57) ABSTRACT

Disclosed are composites comprising copper foils having at least one smooth surface and an adhesive layer with low Dk and Df properties. Also disclosed are copper clad laminates made by laminating the present composites with flexible or rigid substrates that exhibit heat resistance and good to excellent bonding strength. The PCBs made therefrom exhibit low insertion loss and may be assembled with other components to form various electrical devices utilizing high speed of at least 1 Gps or high frequency signals of at least 1 GHz.

14 Claims, 4 Drawing Sheets

(51) Int. Cl.
    *B32B 15/14*   (2006.01)
    *B32B 27/28*   (2006.01)
    *B32B 27/34*   (2006.01)
    *B32B 15/20*   (2006.01)
    *B32B 7/12*    (2006.01)
    *B32B 5/02*    (2006.01)

(52) U.S. Cl.
    CPC ..... *B32B 2307/20* (2013.01); *B32B 2307/538* (2013.01); *B32B 2307/714* (2013.01); *B32B 2457/08* (2013.01); *H05K 2201/0338* (2013.01)

(56) References Cited

U.S. PATENT DOCUMENTS

| | | | |
|---|---|---|---|
| 6,303,680 B1 * | 10/2001 | Neiss | C09J 125/18 524/430 |
| 8,815,387 B2 | 8/2014 | Sato et al. | |
| 9,688,704 B2 | 6/2017 | Shozo et al. | |
| 10,385,076 B2 | 8/2019 | Kunio et al. | |
| 2005/0121229 A1 * | 6/2005 | Takai | B32B 27/36 174/250 |
| 2014/0342178 A1 * | 11/2014 | Saito | H05K 1/09 428/606 |
| 2018/0255646 A1 * | 9/2018 | Moriyama | H05K 3/0061 |
| 2020/0404784 A1 * | 12/2020 | Sung | H05K 1/0306 |
| 2021/0040360 A1 * | 2/2021 | Yamamoto | C09J 153/02 |

FOREIGN PATENT DOCUMENTS

| | | |
|---|---|---|
| TW | 543248 B | 7/2003 |
| TW | 543249 B | 7/2003 |
| TW | I339222 B | 3/2011 |

\* cited by examiner

COMPOSITE AND COPPER CLAD LAMINATE MADE THEREFROM

FIELD OF THE INVENTION

This invention relates to composites for manufacturing copper clad laminates that exhibit reduced conductor loss, dielectric loss, and high peel strength.

BACKGROUND OF THE INVENTION

Nowadays, high speed transmission of electric signals is required for electronic parts in order to raise the information processing speed of electronics and handle high frequency wireless communications. Application of high frequency-matching boards is advancing as well. Therefore, low insertion loss becomes one of the critical properties of the copper clad laminates (CCL) which are made into printed circuit boards for high speed and/or high frequency applications.

To lower the total insertion loss which is the sum of conductor loss and dielectric loss can be achieved by reducing the conductor loss and/or the dielectric loss. To reduce the dielectric loss may be achieved by carefully selecting the dielectric materials with low Dk (dielectric constant, also called relative permittivity) and Df (dissipation factor, also called loss tangent, tan δ) including the substrate, prepreg, and the adhesive if present in the interface of copper foil and the substrate. Under the high speed/high frequency conditions, the current of signal transmission is mainly conduct across the surface of copper foil which is a well-known phenomenon named skin effect. The skin effect is a phenomenon in which a larger amount of current is concentrated in a surface part of a conductor by higher frequency. The current density is reduced at a deeper depth from the surface part. A depth providing 1/e (e is a natural logarithm) of the current density value on the surface is referred to as a skin depth, and serves as an indication of a depth at which a current flows. The skin depth depends on frequency, and is reduced as frequency is increased.

Conventionally, in copper foil used for a copper clad laminate, the surface on the side to be laminated to the substrate is processed to form a roughened surface having projections (or nodules). This roughened surface is made to exhibit an anchoring effect for the substrate. The adhesion strength between the substrate and the copper foil can then be raised to secure reliability of the printed circuit board made therefrom. Although reducing the surface roughness is one of the most efficient way to reduce the conductor loss, the tradeoff of is weakening the adhesion strength as measured by the peel strength between the copper foil and the substrate. Consequently, final products (printed circuit boards) may have deteriorated reliability and performance in a high frequency range (i.e. >1 GHz). One approach to maintain the peel strength with lower surface roughness is to modify the morphology of nodules such as the shape, density, size, etc. during the Cu surface roughening process. For examples, S.-Q. Lin et al disclosed in TW M543248 and TW M543249.

Another approach is to pretreat the unroughened surface of the copper foil with an adhesion promoter or a coupling agent. For example, T. Sato et al discloses in U.S. Pat. No. 8,815,387 that a silane coupling agent layer is formed on the unroughened surface of the copper foil, and then a primer resin layer is formed thereon. An obvious drawback is that the extra adhesion promoter applied on the primer resin usually increases the dielectric loss because of its high Dk/Df property and results in a higher overall insertion loss of the copper clads or PCB device regardless the conductor loss of copper foil has been reduced.

T. Matsunaga et al also disclosed in TW I339222 by using considerable non-copper elements such as nickel or silane to increase the peel strength, anti-rust ability, thermal resistance, or chemical resistance of the copper foil. These non-copper elements, however, possess higher magnetic permeability or higher electric resistance which increase the insertion loss of the copper clads or PCBs significantly.

There remains an ongoing need for composites with low conductor loss, low dielectric loss, and sufficiently high peel strength for preparing copper clad laminates and printed circuit boards that can suitably be used for high speed and/or high frequency applications.

SUMMARY OF THE INVENTION

This invention provides a composite for manufacturing a copper clad laminate comprising a copper foil and an adhesive layer, wherein the copper foil has an electric resistance of 0.170 gΩ/m$^2$ or less, and at least one smooth surface, said smooth surface has a surface roughness (Rz) of 2.0 µm or less, a nodule density of less than 1 piece/µm$^2$, a total content of non-copper metal elements on the smooth surface being 350 µg/dm$^2$ or less;

the adhesive layer is derived from a mixture comprising a resin matrix containing about 5-25 parts by weight of a reactive resin, about 0.1-3 parts by weight of an curing agent, and about 72-94.9 parts by weight of a styrene-based rubber; and about 0-100 parts by weight of an additive based on 100 parts by weight of the resin matrix;

the adhesive layer is in contact with the smooth surface of the copper foil;

the cured adhesive layer at 10 GHz, has a Dk value of 3.0 or less and a Df value of 0.006 or less; and provided that the smooth surface of the copper foil is not pretreated with an adhesion promoter.

This invention also provides copper clad laminates, copper clad circuits, and devices comprising the composites of the present invention.

DETAILS OF THE INVENTION

Figure 1:
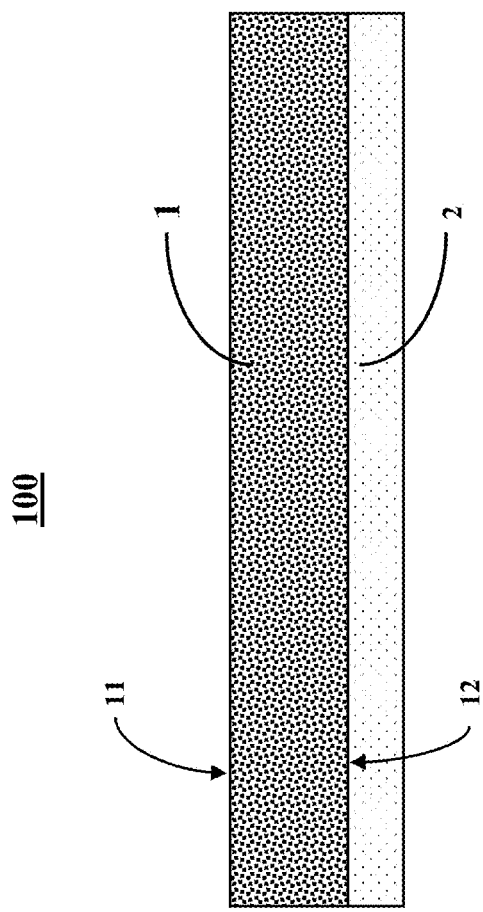
FIG. 1 shows an expanded sideview of one embodiment of the present composite laminate 100, which has a layer construction of: a copper foil 1, having a first surface 11 and a second surface 12, and an adhesive layer 2, wherein the second surface 12 being a smooth surface is in contact with the adhesive layer 2.

All publications, patent applications, patents and other references mentioned herein, if not otherwise indicated, are explicitly incorporated by reference herein in their entirely for all purposes as if fully set forth.

Unless otherwise defined, all technical and scientific terms used herein have the same meaning as commonly understood by one of ordinary skill in the art to which this invention belongs. In case of conflict, the present specification, including definitions, will control.

Unless stated otherwise, all percentages, parts, ratios, etc., are by weight.

As used herein, the term "produced from" is synonymous to "comprising". As used herein, the terms "comprises," "comprising," "includes," "including," "has," "having," "contains" or "containing," or any other variation thereof, are intended to cover a non-exclusive inclusion. For example, a composition, process, method, article, or apparatus that comprises a list of elements is not necessarily limited to only those elements but may include other elements not expressly listed or inherent to such composition, process, method, article, or apparatus.

The transitional phrase "consisting of" excludes any element, step, or ingredient not specified. If in the claim, such a phrase would close the claim to the inclusion of materials other than those recited except for impurities ordinarily associated therewith. When the phrase "consisting of" appears in a clause of the body of a claim, rather than immediately following the preamble, it limits only the element set forth in that clause; other elements are not excluded from the claim as a whole.

The transitional phrase "consisting essentially of" is used to define a composition, method or apparatus that includes materials, steps, features, components, or elements, in addition to those literally discussed, provided that these additional materials, steps features, components, or elements do not materially affect the basic and novel characteristic(s) of the claimed invention. The term "consisting essentially of" occupies a middle ground between "comprising" and "consisting of".

The term "comprising" is intended to include embodiments encompassed by the terms "consisting essentially of" and "consisting of". Similarly, the term "consisting essentially of" is intended to include embodiments encompassed by the term "consisting of".

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. For example, when a range of "1 to 5" is recited, the recited range should be construed as including ranges "1 to 4", "1 to 3", "1-2", "1-2 & 4-5", "1-3 & 5", and the like. Where a range of numerical values is recited herein, unless otherwise stated, the range is intended to include the endpoints thereof, and all integers and fractions within the range.

When the term "about" is used in describing a value or an end-point of a range, the disclosure should be understood to include the specific value or end-point referred to.

Further, unless expressly stated to the contrary, "or" refers to an inclusive "or" and not to an exclusive "or". For example, a condition A "or" B is satisfied by any one of the following: A is true tor present) and B is false (or not present), A is false (or not present) and B is true (or present), and both A and B are true (or present).

"Mol %" or "mole %" refers to mole percent.

Embodiments of the present invention as described in the Summary of the Invention include any other embodiments described herein, can be combined in any manner, and the descriptions of variables in the embodiments pertain not only to the composite laminate of the present invention, but also to the articles made therefrom.

The invention is described in detail herein under.

Copper Foil

Copper foils include rolled annealed (RA) copper foils and electrodeposited (ED) copper foils. Generally, an ED copper foil has a matte surface (deposit surface) and a glossy shiny surface (drum surface), whereas the RA copper foil has both surfaces being smooth. As the present composites are aimed to be incorporated into CCLs and PCBs for high frequency and/or high speed applications, suitable copper foil has high purity with an electric resistance of 0.170 gΩ/m$^2$ or less. The copper foil has at least one smooth surface, which is characterized by having a surface roughness (Rz) of 2.0 µm or less as measured by the method described in the EXAMPLES part below. Furthermore, the smooth surface has a nodule density of less than 1 piece/µm$^2$, or 0.5 piece/µm$^2$, or 0.3 piece/µm$^2$, or 0.1 piece/µm$^2$, or not roughened at all. For a copper foil surface that has been roughed is generally expected to have a nodule density of more than 3 pieces/µm$^2$.

As used herein, the smooth surface of the copper foil is also referred as the "lamination side" since it's the side facing toward a substrate when the present composite is used to make a CCL. The opposing side of the copper foil is referred as the "resist side" (or wiring side).

In some instances, one or more passivation layers can be applied on one or both surfaces of the copper foil to provide additional desired properties such as antirust, thermal resistance, and chemical resistance, etc. Suitable materials for forming a passivation layer include non-copper metal elements such as zinc, nickel, chromium, cobalt, molybdenum, tungsten, and combinations thereof. Maintaining the total content of non-copper metal elements on the smooth surface of the copper foil being 350 µg/dm$^2$ or less allows preserving the desired properties without compromising the low conductor loss property.

Noted that the surface properties of the resist side is subjected to many subsequent printed circuit fabrication processes such as micro-etch, acid rinse, brown oxide, black oxide, pre-solder-mask treatment, etc. It's understandable that there are no requirements for the surface roughness and total content of non-copper metal elements deposited.

Regardless of the presence of any passivation layer, the smooth surface of the copper foil isn't treated with any adhesion promoter for use to improve adhesion between the copper foil and the substrate. Known adhesion promoters (also named as coupling agent) for treating a copper surface include silanes and silyl amines disclosed in U.S. Pat. No. 5,861,076 to Adlam et al and U.S. Pat No. 8,8815,387 to Sato et al; allyl phosphite esters and allyl phosphate esters disclosed in U.S. Pat. No. 4,521,558 to Mowdood; azole silanes disclosed in U.S. Pat. No. 9,688,704 to Miura et al; unsaturated amido group substituted heterocyclic compounds disclosed in EP-A-0251490; amino triazine based compounds in U.S. Pat. No. 10,385,076 to Mori et al; and a number of references cited therein.

The copper foil of the present composite has a thickness in the range of about 6 μm to about 400 μm, or about 12 μm to about 70 μm, or about 18 μm to about 35 μm.

Copper foils suitable for use in the present composite are commercially available from, for example, Chang Chun Petrochemical Co.; Nan Ya Plastics Co.; Mitsui Mining & Smelting Co.; Furukawa Electric Co.; or Fukuda Metal Foil & Powder Co.

Adhesive Layer

The adhesive layer of the present composite is in contact with the smooth surface of the copper foil and expect to provide good adhesion to a substrate for producing a copper clad laminate having a dielectric loss no more than that of the substrate itself.

The adhesive layer is derived from a mixture comprising a resin matrix containing about 5-25 parts by weight of a reactive resin, and about 0.1-3 parts by weight of an curing agent, and about 72-94.9 parts by weight of a styrene-based rubber; and about 0-100 parts by weight of an additive based on 100 parts by weight of the resin matrix.

Examples of the reactive resins include epoxy resin, acrylic resin, phenolic resin, imide resin, or a combination thereof; preferably, epoxy resin.

A variety of epoxy resins may be used, including bisphenol A-type epoxy, bisphenol F-type epoxy, phenol-novolak type epoxy, cresol-novolak type epoxy, glycidyl ether type epoxy, naphthalene-type epoxy, or the like. However, in order to properly control the reaction, it is preferred to use epoxy resins containing at least two epoxy groups in each molecule. The above mentioned epoxy resins may be used singly or in combination of two or more.

Depends on the type of epoxy resin employed, one skilled artisan can easily choose suitable curing agent, then decide the adequate amounts according to the molar equivalent of the reactive resin. For example, the curing agent may include amines, such as dicyanodiamide, imidazols and aromatic amines; phenols, such as bisphenol A and brominated bisphenol A; novolaks, such as phenol novolak resin and cresol novolak resin; and acid anhydrides, such as phthalic anhydride, and so on.

Examples of styrene-based rubbers include polystyrene and block copolymers such as styrene-isoprene-styrene (SIS), styrene-butadiene-styrene (SBS), styrene-ethylene-butadiene-styrene (SEBS), styrene-ethylene-propylene-styrene (SEPS), or mixtures thereof.

The styrene-based rubbers may be grafted or copolymerized with an unsaturated carboxylic acid and/or an acid anhydride thereof to obtain an acid-modified rubber. Examples of the unsaturated carboxylic acid or the anhydride thereof suitable for use as the acid modification include maleic acid, acrylic acid, itaconic acid, crotonic acid, maleic anhydride, and itaconic anhydride. Especially, maleic anhydride is suitably used. By using the acid-modified rubber, it may further enhance the adhesion reliability without increasing the Dk and/or Df values.

The graft ratio of the acid-modification is, for example, about 0.05 weight % to 10.0 weight %, preferably about 0.1 weight % to 5.0 weight % based on the styrene-based rubber to be grafted. When the graft ratio is less than the above range, adhesive strength may be insufficient. On the other hand, when the graft ratio is more than the above range, the styrene-based rubber may aggregate and compatibility and dispersibility may decrease, so that production efficiency tends to decrease.

In the present invention, a variety of additives may be added to the mixture forming the adhesive layer to provide beneficial functionalities. For example, suitable additives include, but not limit to adhesion promoters, antioxidants, antistatic agents, colorants, fillers, flame retardants, impact modifying agents, lubricants, processing aids, thermo-stabilizers, UV absorbers, and the like. Said additives may be added to the resin mixture as long as the effects of the present invention are not impaired.

Examples of useful fillers and flame retardants for the present mixture include, but are not limited to, aluminum oxide, organophosphorus salt, silica, calcium carbonate, magnesium carbonate, magnesium calcium carbonate, calcium oxide, magnesium oxide, talc, magnesium silicate, aluminum silicate, magnesium aluminum silicate, calcium silicate, clay, mica, barium sulfate, boron nitride, aluminum nitride, barium titanate, strontium titanate, alumina trihydrate and calcium sulphate.

The mixture forming the adhesive layer is preferably mixed with a solvent capable of dissolving or dispersing the reactive resin, the styrene-based rubber, optional additives, and the curing agent.

Suitable solvents include, for example, methyl ethyl ketone, toluene, methyl cyclohexane, tetrahydrofuran, chlorobenzene, trichlorethylene, or methylene chloride; so long as the solvent does not adversely affect the adhesion properties of the resin mixture. These solvents may be optionally mixed according to the composition of the resin mixture. For example, a mixture of methyl ethyl ketone and toluene being 1:1-100, or the like may be employed.

The solid content of the mixture forming the adhesive layer is from about 10 weight % to about 60 weight %, or from about 15 weight % to about 45 weight %, based on the total weight of the mixture.

In addition to having good adhesion strength, suitable resin mixtures preferably have low Df and Dk values after curing. The evaluation may be done by applying a resin mixture on a releasable substrate to form an adhesive layer with a thickness of 25 μm. After stacking, drying, and curing completely, the Df and Dk were measured according to the method described in the EXAMPLES part below.

The inventors discovered that the cured adhesive layer preferably has a Dk of 3.0 or less, or 2.5 or less at 10 GHz, and a Df of 0.0060 or less, or 0.0040 or less, or 0.0020 or less at 10 GHz.

Suitable resin mixture may be prepared according to the adhesive composition disclosed in U.S. Pat. Application. No. 2016/0137889A1, or may be purchased from commercial sources such as Pyralux® GPL or Pyralux® GFL from DuPont.

Composite of the Invention

The composite 100 of the invention comprises a copper foil 1 and an adhesive layer 2, wherein the copper foil has a first surface 11 and a second surface 12 (i.e. the smooth surface). The mixture forming the adhesive layer was applied to the smooth surface 12 of the copper foil as shown in FIG. 1.

The mixture forming the adhesive layer 2 may be applied by various coating methods that are well known in the art, including spray coating, curtain coating, knife over roll coating, air knife coating, slot die coating, casting, direct gravure, reverse gravure, offset gravure, roll coating, dip coating or immersion coating. Noted that the resist side of the copper foil may be covered with a releasable protective layer when dip coating or immersion coating is employed. In some embodiments, slot die coating may be used.

Any appropriate application method that would be readily determined by one skilled in the art may be utilized to apply the resin mixture. As used herein, the term "coating" is not intended to limit the method by which it is applied onto the smooth surface of the copper foil.

After coating, the solvent or mixed solvents may be removed by heating in an oven at a temperature in the range of 60-160° C. to ensure the mixture is partially cured in B stage. The temperature and length of time in the oven will depend on the solvent used and thickness of the coating layer. Alternatively, the composite of the present invention can be fabricated by coating a layer of the mixture on a release liner or a carrier film first, then transferring the coated layer to the smooth surface of the copper foil by lamination.

The thickness of the adhesive layer of the present composite varies depending upon the ultimate use of the composite. The adhesive layer of the present composite before lamination with a substrate has a thickness in the range of about 0.1 µm to about 200 µm, or about 0.5 µm to about 100 µm, or about 1 µm to about 50 µm, or about 3 µm to about 20 µm. While such thicknesses are preferred, it is to be understood that other thicknesses may be produced to satisfy a particular need and yet fall within the scope of the present invention.

The present composite generally has a total thickness of from about 6.1 µm to about 600 µm, or from about 10 µm to about 150 µm, or from about 15 µm to about 100 µm. The total thickness of the present composite can be adjusted according to the substrate type by varying the thickness of the adhesive layer, the thickness of the copper foil, or both.

Copper Clad Laminate

The present composite can be incorporated into a copper clad laminate (CCL) by laminating onto a substrate. Suitable substrates to form the present CCL may be rigid or flexible.

Flexible substrates include, but are not limited to polyimide (PI) film, polyamide-imide (PAI) film, liquid crystal polymer film, or fluorine-based polymer film. Commercially available polyimide films include Kapton® from DuPont, APICAL™ from Kaneka, UPILEX® from Ube; polyimide-imide films such as Torlon® from Solvay.

Rigid substrates are generally derived from a prepreg, which is formed by impregnating a polymeric material into a fibrous reinforcement member. Examples of a fibrous reinforcement member includes woven glass fabrics such as E glass (aluminosilicate glass) cloth, nonwoven glass fabrics, and nonwoven aramid fabrics.

Polymeric materials suitable for impregnating include, but are not limited to epoxy resins, polyphenylene ethers (PPE), polyphenlylene oxides (PPO), liquid crystal polymers (LCP), polyimides (PI), polyamide amides (PAI), polyether imides (PEI), polyesters, polyolefins, poly(meth) acrylates, polyphenylene sulfides (PPS), polyoxymethylenes (POM), polyaryletherketones (PAEK), polyether ether ketones (PEEK), polysulfones (PSU), polyether sulfones (PES), cyanate esters, polyethers, or fluorine-based polymers.

Examples of epoxy resins include, but are not limited to bifunctional or polyfunctional Bisphenol A or Bisphenol F resins, epoxy-novolak resins, or brominated epoxy resins.

Examples of polyesters include, but are not limited to polybutylene terephthalates (PBT), polyethylene terephthalates (PET), or polyethylene naphthalates (PEN).

Examples of polyolefins include, but are not limited to polypropylenes (PP) or polyethylenes (PE).

Examples of fluorine-based polymers include, but not limited to tetrafluoroethylene polymer (PTFE), tetrafluoroethylene hexafluoropropylene copolymer, tetrafluoroethylene perfluoro(alkylvinylether)copolymer (PFA), tetrafluoroethylene ethylene copolymer, polychlorotrifluoroethylene, ethylene chlorotrifluoroethylene copolymer, polyvinylidene-fluoride, vinylidene-fluoride hexafluoropropylene copolymer, or polyvinyl fluoride.

Examples of commercially available prepregs include 2929 bondply material (based on PTFE, Dk=2.9 and Df=0.3 at 10 GHz) and RO4450™ prepreg (Dk being 3.30-3.54 at 10 GHz depends on thickness), available from Rogers Corp; R-5670 prepreg material (based on PPE, Dk=3.35, Df=0.004 at 12 GHz) available from Panasonic Corp; MCL-HS100 prepreg material (based on epoxy resin, Dk=3.4-4.1, Df=0.0025-0.0055 at 10 GHz) available from Hitachi Chemical Co., Ltd.

Figure 2:
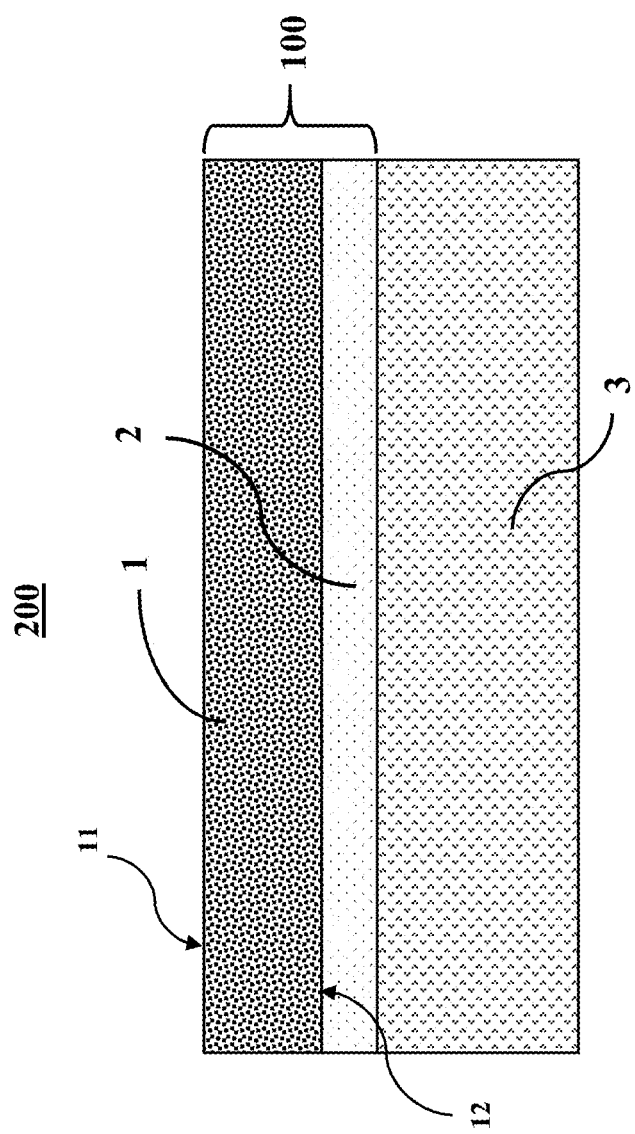
FIG. 2 shows an expanded sideview of one embodiment of the present copper clad laminate 200, which is a single side CCL having a layer construction in sequence of: the present composite 100, composed of a copper foil 1 and an adhesive layer 2; and a substrate 3, wherein the substrate 3 is in contact with the adhesive layer 2.
Figure 3:
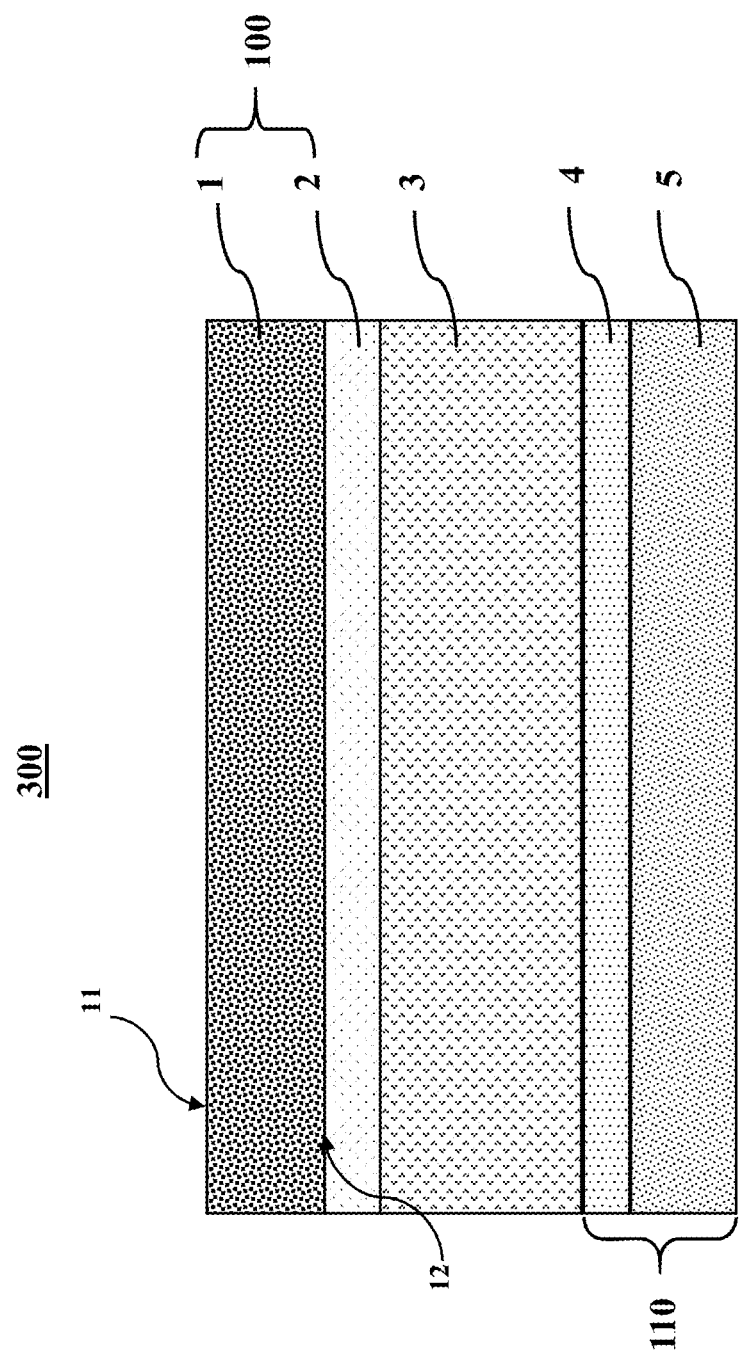
FIG. 3 shows an expanded sideview of one embodiment of the present copper clad laminate 300, which is a double side CCL having a layer construction in sequence of: the present composite 100, composed of a copper foil 1 and an adhesive layer 2; a substrate 3; an optional adhesive layer 4, and a second copper foil 5; wherein the second copper foil 5 and the copper foil 1 may be the same or different; when the adhesive layer 4 exists, the adhesive layer 4 and the second copper foil 5 may also be an embodiment of the present composite 110, which is the same or different from the composite 100.
Figure 4:
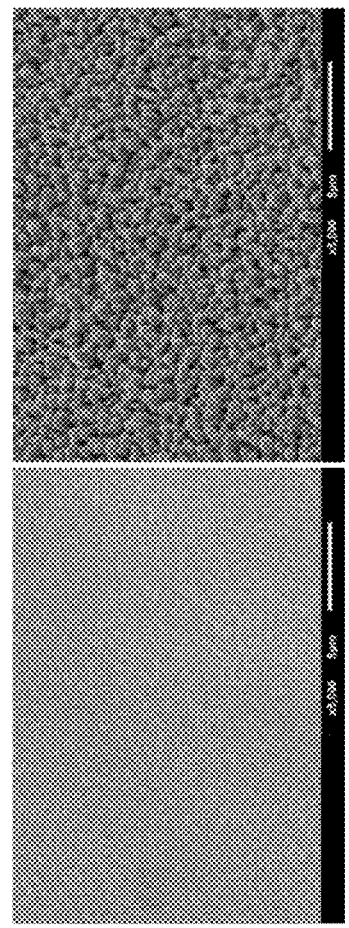
FIG. 4 shows a visual comparison of the photomicrograph of a smooth surface of a copper foil 4A (having a surface roughness (Rz) of 0.62 µm) versus a roughened surface of a copper foil 4B (purchased from Fukuda, having a surface roughness of 3.57 µm and a nodule density of 1.5 pieces/µm$^2$).

The present composite may be bonded onto one or both surfaces of a substrate corresponding to an application to form a single side CCL as shown in FIG. 2 or a double side CCL as shown in FIG. 3.

As shown in FIG. 2, a composite 100 of the invention is placed onto a substrate 3 with the adhesive layer 2 in contact with the substrate 3, then laminated by a method such as hot pressing, continuous rolling, continuous belt pressing, or the like, to provide a single side CCL, i.e. an embodiment of the invention.

Similarly, as shown in FIG. 3, a double side CCL 300 of the invention may be made by combining in sequence of the present composite 100, a substrate 3, an optional adhesive layer 4, and a second copper foil 5; then laminated together by a method mentioned previously; wherein the substrate 3 is in contact with the adhesive layer 2. Noted that the second copper foil 5 and the copper foil 1 may be the same or different.

In some embodiments, when the adhesive layer 4 is absent, the second copper foil 5 of double side CCL 300 of the invention, preferably has its roughened surface (i.e. also referred as the lamination surface herein) in contact with the substrate 3 to ensure adequate bonding, and said roughened surface may be pretreated with an adhesion promoter.

In some embodiments, the adhesive layer 4 is present to enhance the adhesion between the second copper foil 5 and the substrate 3 regardless the second copper foil 5 and the copper foil 1 being the same or different.

In other embodiments, the adhesive layer 4 and the second copper foil 5 are derived from a composite 110 of the invention, where the composite 110 and the composite 100 may be the same or different.

Process parameters such as temperatures, pressures, and times for preparing the present copper clad laminates are generally dependent on the material properties of the substrate as well as the preparation method. One skilled in the art can decide suitable process parameters accordingly.

In some embodiments, the present copper clad laminate is prepared by hot pressing.

In some embodiments, the hot pressing is performed at a temperature ranging from about 80° C. to about 250° C., or from about 135° C. to about 225° C.; at a pressures ranging from about 0.2 MPa to about 17.4 MPa, or from about 0.5 MPa to about 5 MPa; and for a duration from about 30 minutes to about 300 minutes, or from about 60 minute to about 240 minutes.

The present copper clad laminate generally has a total thickness of from about 30 µm to about 2000 µm, or from about 50 µm to about 1500 µm, or from about 90 µm to about 1000 µm. The total thickness of the present copper clad laminate can be adjusted easily by using the present composite and the substrate of various thicknesses.

The present invention is to use a composite comprising a copper foil having at least one smooth surface, that is not roughened and no pretreatment of an adhesion promoter, and an adhesive layer composed of low Dk and Df resin materials to produce a copper clad laminate having good to excellent peel strength. The peel strength of present CCL may be, for example, 0.4 kN/m or more, or 0.6 kN/m or more, or 0.8 kN/m or more. Noted that the peel strength data varies as the substrate may vary. Here, the peel strength is measured according to the method described in the EXAMPLES part below.

In addition, the present copper clad laminates also have excellent thermal resistance, and are expected to withstand the soldering and re-flow steps during the PCB fabrication processes. For example, the present CCL can withstand a thermal treatment for at least 30 seconds or longer without blistering formation or delamination of the specimens at 260° C., or 288° C., or even 320° C. or higher. Here, the thermal resistance to soldering temperature is a value measured by the method described in the EXAMPLES part below.

Printed Circuit Board (PCB)

The copper clad laminate of the invention may be subjected to known patterning methods such as a subtractive method (photolithography) or an additive method (electroplating) to form a predetermined conductor pattern (i.e. circuit) on the resist side of the copper foil to produce a printed circuit board (PCB, or print wiring board). Because the manufacturing processes for PCBs are well known to one skilled in the art, the disclosure of which is omitted herein tier the interest of brevity.

The printed circuit boards produced from the present composite and CCL can then be assembled with other components such as leads and holes to form various electrical articles utilizing high speed signals with a data rate of at least 1 Gbps, and/or high frequency signals of at least 1 GHz.

The printed circuit board comprising the composite and CCL of the present invention, at a frequency of 10 GHz, an insertion loss being 2.5 dB/10 cm or less, or 2.0 dB/10 cm or less, or 1.5 dB/10 cm or less, at a frequency of 39 GHz, an insertion loss being 8.0 dB/10 cm or less, or 7.0 dB/10 cm or less, or 6.0 dB/10 cm or less. Here, the insertion loss is a value measured by the method described in the EXAMPLES part below.

Products utilizing the high performance PCBs include servers, routers, storage area networks, power amplifiers, transceiver modules, and high speed data channels.

In addition, consumer devices demanding higher data rate and computing performance include mobile electronic devices such as laptop computers, tablet computers, e-readers, portable game devices, portable media players, digital cameras, cellular telephones, or wearable devices; smart home devices; manned and unmanned vehicles; aviation devices such as drones, airplanes, and space equipment; and so on.

Without further elaboration, it is believed that one skilled in the art using the preceding description can utilize the present invention to its fullest extent. The following examples are, therefore, to be construed as merely illustrative, and not limiting of the disclosure in any way whatsoever.

EXAMPLES

The abbreviation "E" stands for "Example" and "CE" stands for "Comparative Example" is followed by a number indicating in which example the copper clad laminate is prepared. The examples and comparative examples were all prepared and tested in a similar manner.

Materials

CF1: is a copper foil having a thickness of 12 μm; the smooth surface of the foil has a surface roughness (Rz) of 0.62 μm and plated with less than 100 μg/dm² of non-copper elements. A copper foil having the same grade as CF1 except a thickness of 35 μm was tested and found to have an electrical resistance of 0.170 gΩ/m² or less.

CF2: is an ED copper foil having a thickness of 35 μm; the smooth surface of the foil has a surface roughness (Rz) of 1.06 μm and plated with less than 100 μg/dm² of non-copper elements. A piece of CF2 copper foil was tested and found to have an electrical resistance of 0.170 gΩ/m² or less.

CF3: is an ED copper foil, product no. HVLP2, having a thickness of 12 μm; the lamination surface of the foil has a surface roughness (Rz) of 3.21 μm and plated with 300-350 μg/dm² of non-copper elements. A copper foil having the same grade as CF3 except a thickness of 35 μm was tested and found to have an electrical resistance of 0.170 gΩ/m² or less.

CF4: is an ED copper foil, product no. HVLP1, having a thickness of 12 μm; the lamination surface of the foil has a surface roughness (Rz) of 4.22 μm, and the plated with 350-400 μg/dm² of non-copper elements. A copper foil having the same grade as CF4 except a thickness of 35 μm was tested and found to have an electrical resistance of 0.170 gΩ/m² or less.

Adh1: is a bonding sheet available from DuPont with the product name: Pyralux® GFL. A cured Adh1 sample was tested for the Dk and Df according to the procedure described below, and found to have an Dk of 2.8, and a Df of 0.0035.

Adh2: is a bonding sheet available from DuPont with the product name: Pyralux® GPL." A cured Adh2 sample was tested for the Dk and Df according to the procedure described below, and found to have an Dk of 2.4, and a Df of 0.0017.

S1: is a ultra-low loss planar prepreg with a thickness of about 130 μm, which is composed of a woven glass fiber fabric and impregnated with modified epoxy resin and has a Dk=3.62 and Df=0.005 at 10 GHz (tested according to the conditions specified by IPC-TM-650 No. 2.5.5.13).

S2: is an low loss planar prepreg with a thickness of about 130 μm, which is composed of a woven glass fiber fabric and impregnated with epoxy resin and has a Dk=3.9-4.0 and Df=0.005-0.006 at 1 GHz (tested according to the conditions specified by IPC-TM-650 No. 2.5.5.9).

Preparation of the Composites A and B

The Adh1 was transferred from the carrier film (a 132 μm of release paper) to the smooth surface of a piece of copper foil (CF1, 29 cm×20 cm) by lamination with roller laminator at a roller temperature of 120° C., at about 0.3 MPa, and a line speed of 0.5 m/min to provide a piece of Composite A, i.e. one embodiment of the invention. The resulting composite A has a thickness of about 16.5 μm with an adhesive layer thickness of 4.5 μm.

Composite B was obtained according to the procedures describe above, except using Adh2 to replace the Adh1 to apply onto the smooth surface of a piece of copper foil (CF2). The resulting Composite B has a thickness of about 39 μm with an adhesive layer thickness of 4 μm.

Preparation of the Copper Clad Laminate of Examples 1-3

The copper clad laminates of the working examples (E1-3) had a construction as the double side copper-clad laminate 300 in FIG. 3 and the optional layer 4 was absent. The CCLs were manufactured by using a hot pressing machine (manufactured by LCM) as follows:

A substrate sheet (S1 or S2) were cut into a square sheet of 30 cm×30 cm, a composite obtained by the procedure described above (Composite A or B) was placed on the substrate with the adhesive layer in contact with the substrate. A piece of copper foil (CF3) was applied to the opposite side of substrate with its lamination surface in direct contact with the substrate.

The lamination parameters were adjusted according to the substrate's recommended lamination parameters. The lamination was performed under vacuum of 0.99 atm (751 torr) with the temperature and pressure profiles as follows:

Temperature profile: (1) started from 80° C. and heated to 120° C. within 5 min, (2) held at 120° C. for 3 min and heated to 180° C. within 5 min, (3) held at 180° C. for 32 min and heated to 210° C. within 5 min, (4) held at 210° C. for 143 min and cooled to 160° C. within 12 min, (5) cooled to 50° C. within 1 mm and held at 50° C. for 30 min.

Pressure profile: (1) increased to 0.3 MPa within 1 min, (2) held on 0.3 MPa for 3 min and increased to 1.0 MPa within 1 min, (3) held on 1.0 MPa for 11 min and increased to 3.4 MPa within 1 min, (4) held on 3.4 MPa, for 176 min and decreased to 2.7 MPa within 1 min, (5) held on 2.7 MPa for 11 min and decreased to 0.1 MPa within 1 min, (6) held on 0.1 MPa for 30 min.

Preparation of Copper Clad Laminates of Comparative Examples 1-6

Each copper clad laminate of the comparative examples (CE1-6) was prepared by laminating a piece of copper foil (CF1, CF3, or CF4) directly to a substrate (S1 or S2) with the smooth surface or the lamination surface of the copper foil in contact with the substrate. On the opposite side of the substrate, a piece of copper foil (CF3) was also laminated to the substrate with its lamination surface in direct contact with the substrate. The lamination was performed according to the lamination condition described above for the Examples 1-3.

Preparation of Testing Coupon of Examples 1 and 3 and Comparative Examples 1-6

Each copper clad laminate of the examples and comparative examples was further processed to form a microstrip structure having a total thickness of about 162 μm, a conductor length of 100 mm, a conductor thickness of 12 μm, and a conductor width of 300 μm for those CCLs using S1 as substrate, and 275 μm for the CCLs using S2 as substrate, respectively.

The testing results are listed in Tables 1 to 3.

Testing Methods

Surface Roughness (Rz): was measured at five points using a laser scanning microscope (manufacturing by KEYENCE, model: VK-9700), and the data were averaged.

Layer thickness: the thickness of the adhesive layer of the Compositive A or B was determined by a contact thickness gage. Each specimen was measured 6-10 times at different spots, and the results were averaged.

Electrical resistance test: According to IPC-TM-650 2.5.14. copper foil sample in thickness of 35 μm was used, and the sample was annealed at 200° C. for 2 hr in $N_2$ oven.

Solder floating test: This test simulates the thermal shock encountered in solder reflow component assembly processes for printed circuit boards. Three specimens per each CCL (size: 5 cm×5 cm) were floated on a molten solder (99.3% tin, 0.7% copper) bath by placing the CF3 side down at 260° C. or 288° C. for 3 minutes. The specimens were removed, then cooled to ambient temperature, and visually examined the specimens. The top side (i.e. opposite to the CF3 side) of the specimen was visually examined and marked as "Pass" if no degradation such as blister formation and delamination were found.

Chemical resistance and aging performance: each CCL example was subjected to different chemical treatments. For the HCl resistance testing, a specimen was immersed in a container having 18% HCl solution for 60 min, then removed from the container, rinsed with DI water, air dried at room temperature for 24 h, and visually examined the appearance of the specimen. Repeating the similar procedure by subjecting each specimen made from the corresponding CCL example to other chemical treatments including 8% NaOH for 30 min, 3% $H_2SO_4$ at 50° C. for 60 min. Finally, a specimen was placed in an oven at 180° C. for 10 days. Afterwards, the specimens were sent for the peeling strength test to determine if the chemical treatments or aging test would cause any deterioration.

Peel strength test: the CCL specimens, either as prepared or obtained after chemical treatment/aging test, were cut to a rectangle sample of 75 mm×30 mm. The sample was then patterned by photolithography with straight lines with the line/space being 1 mm/1 mm. The patterned laminate sample was fastened on a FR4 plate (i.e. a fiberglass plate, purchased from HONTEC) with a size of 98 mm (L)×31 mm (W) by a double-sided tape, and then mounted onto a sliding sample holder. Then, the front portion of the patterned laminate sample was peeled apart manually and was clamped to the upper clamp. By using a test machine (manufactured by SHIMADZU company, model: AG-IS), the peel strength was tested with a pulling speed of 50.8 mm/min, and the peel strength was measured and recorded in unit of kN/m. The peel strength data of three test lines were averaged and listed in Tables 1-2.

Dk/Df measurement: an adhesive sample (adh1 or adh2) coated on a releasable PET film with a thickness of about 25 μm, then the adhesive layer was stacked up to a thickness of about 85-125 μm, and fully cured at 200° C. for 90 min to produce a cured adhesive sample. The cured adhesive sample was tested by using a split post dielectric resonator (SPDR) cavity at 10 GHz and a vector network analyzer (manufacturer: Keysight, model no. E5063A). Each sample was tested twice, and the two data were averaged to obtain the Dk/Df data.

Insertion Loss: a CCL specimen having a microstrip structure without a coverlay film was measured by a Keysight PNA Network Analyzer, and scanned from 10 MHz to 40 GHz with a reference impedance of 50Ω, sweep number: 4001 points, calibration: Keysight AFR, temperature: 23° C. Among the measurement values, the transmission losses (dB/m) corresponding to the frequencies at 10 GHz and 39 GHz were reported in Table 3. The improvement of insertion loss was calculated by dividing the difference between the measured insertion loss data of the comparing example and the reference example over the data of the comparing example.

TABLE 1

| Sample ID | CE1 | CE2 | CE3 | E1 | E2 |
|---|---|---|---|---|---|
| Laminate Construction[a] | CF1/S1/CF3 | CF3/S1/CF3 | CF4/S1/CF3 | Composite A/ S1/CF3 | Composite B/ S1/CF3 |
| Solder floating test @288° C. | blister | Pass | Pass | Pass | Pass |
| Solder floating test @260° C. | blister | Pass | Pass | Pass | Pass |
| Peel strength (kN/m) | | | | | |
| as prepared | 0.5 | 0.3 | 0.4 | 0.4 | 1.0 |
| 18% HCl for 60 min | 0.3 | 0.3 | 0.3 | 0.4 | 0.9 |
| 8% NaOH for 30 min | 0.4 | 0.4 | 0.4 | 0.4 | 1.1 |
| 3% $H_2SO_4$ at 50° C. for 60 min | 0.3 | 0.4 | 0.4 | 0.4 | 1.0 |

[a]For the laminate construction, the "/" is used to separate each distinctive layer with the adjacent layer(s).

From the results of Table 1, the followings are evident.

Comparison between the data of E1 and E2 versus CE1, the CCLs of E1 and E2 demonstrated better thermal resistance, maintaining high peel strength through various acid/base treatments.

Comparing the data of E1 versus that of CE2 and CE3, having the same substrate (i.e. S1) and copper foil thickness, the laminates of E1 demonstrated similar thermal resistance, peeling strength, and maintaining the peeling strength through various acid/base treatments. These results indicate that the composite and CCL of the invention are suitable to provide PCBs with excellent performance and reliability even after multiple harsh conditions through the fabrication processes.

TABLE 2

| Sample ID | CE4 | E3 |
|---|---|---|
| Laminate Construction[a] | CF1/S2/CF3 | Composite A/S2/CF3 |
| Solder floating test @288° C. | blister | Pass |
| Solder floating test @260° C. | blister | Pass |
| Peel strength (kN/m) | | |
| as prepared | 0.1 | 0.6 |
| 18% HCl for 60 min | 0 | 0.6 |
| 8% NaOH for 30 min | 0 | 0.6 |
| 3% $H_2SO_4$ at 50° C. for 60 min | 0 | 0.7 |
| Aging at 180° C. for 10 days | 0 | 0.8 |

[a]For the laminate construction the "/" is used to separate each distinctive layer with the adjacent layer(s).

From the results of Table 2, the followings are evident.

Comparison between the solder floating data of E3 versus CE4, the CCL of E3 also demonstrated surprisingly better performance in thermal resistance, and peel strength through various acid/base treatments, and the aging test. These results indicate that the present composites are compatible with various substrates, and the CCLs of the invention may provide PCBs with excellent performance and reliability even at high working temperature.

TABLE 3

| Sample ID | Laminate Construction[a] | Insertion Loss @10 GHz (dB/10 cm) | % of Improvement | Insertion Loss @39 GHz (dB/10 cm) | % of Improvement |
|---|---|---|---|---|---|
| E1[b] | Composite A/ S1/CF3 | 1.38 | — | 4.37 | — |
| CE2 | CF3/S1/CF3 | 1.49 | 7 | 4.78 | 9 |
| CE3 | CF4/S1/CF3 | 1.70 | 19 | 5.55 | 21 |
| E3[b] | Composite A/ S2/CF3 | 1.99 | — | 7.12 | — |
| CE5 | CF3/S2/CF3 | 2.04 | 2 | 7.39 | 4 |
| CE6 | CF4/S2/CF3 | 2.30 | 13 | 8.29 | 14 |

[a]For the laminate construction, the "/" is used to separate each distinctive layer with the adjacent layer(s).
[b]the data of the example was used as the reference to calculate the improvement versus the comparing example.

From the results of Table 3, the followings are evident.

Comparison between the insertion loss data of E1 versus that of CE2 and CE3 as they have the same substrate, the CCLs of E1 surprisingly provided a lower insertion loss values than that of the CCLs of CE2 and CE3.

Comparison between the insertion loss data of E3 versus that of CE5, and CE6 as they have the same substrate, the CCLs of E3 also showed a significantly lower insertion loss values than that of the CCLs of CE5, and CE6. The results demonstrate that the present composite and CCL are suitable for producing printed circuit boards with low insertion loss for high frequency or high speed circuit use.

While the invention has been illustrated and described in typical embodiments, it is not intended to be limited to the details shown, since various modifications and substitutions are possible without departing from the spirit of the present invention. As such, modifications and equivalents of the invention herein disclosed may occur to persons skilled in the art using no more than routine experimentation, and all such modifications and equivalents are believed to be within the spirit and scope of the invention as defined by the following claims.

What is claimed is:

1. A composite for manufacturing a copper clad laminate comprising a copper foil and an adhesive layer, wherein:
   the copper foil has:
      an electric resistance of 0.170 gΩ/m² or less;
      at least one smooth surface with a surface roughness (Rz) of 2.0 μm or less;
      a nodule density of less than 0.1 piece/μm²; and
      a passivation layer comprising non-copper metal elements on the smooth surface having a total content of non-copper metal elements of 350 μg/dm² or less;
   the adhesive layer is derived from a mixture comprising a resin matrix containing about 5-25 parts by weight of a reactive resin, about 0.1-3 parts by weight of a curing agent, and about 72-94.9 parts by weight of an acid-modified styrene-based rubber; and about 0-100 parts by weight of an additive based on 100 parts by weight of the resin matrix;
   the adhesive layer is in contact with the smooth surface of the copper foil via the passivation layer;
   the cured adhesive layer at 10 GHz has a $D_k$ of 3.0 or less and a $D_f$ of 0.006 or less; and
   the smooth surface of the copper foil is not pretreated with an adhesion promoter.

2. The composite of claim 1, wherein the copper foil has a thickness of about 6 μm to about 400 μm.

3. The composite of claim 1, wherein the adhesive layer has a thickness of about 0.1 μm to about 200 μm.

4. A copper clad laminate comprising a substrate and the composite of any one of claims 1-3, wherein the substrate is a film comprising polyimide, polyamide-imide, liquid crystal polymer, or fluorine-based polymer.

5. A copper clad laminate comprising a substrate and the composite of any one of claims 1-3, wherein:
   the substrate is a prepreg comprising a fibrous reinforcement member impregnated with a polymeric material;
   the fibrous reinforcement member is a woven glass fabric, a nonwoven glass fabric, or a nonwoven cram id fabric; and
   the polymeric material is an epoxy resin, a polyphenylene ether, a polyphenylene oxide, a liquid crystal polymer, a polyimide, a polyamide imide, a polyether imide, a polyester, a polyolefin, a poly(meth)acrylate, a polyphenylene sulfide, a polyoxymethylene, a polyaryletherketone, a polyether ether ketone, a polysulfone, a polyether sulfone, a cyanate ester, a polyether, or a fluorine-based polymer.

6. The copper clad laminate of claim 4, wherein the copper clad laminate has:
   a peel strength of 0.4 kN/m or more;
   a heat resistance at 260° C. for more than 30 seconds; and
   an insertion loss at 10 GHz of 2.5 dB/10 cm or less, or at 39 GHz of 8.0 dB/10 cm or less.

7. A printed circuit board comprising the copper clad laminate of claim 4.

8. A device comprising the printed circuit board of claim 7, wherein:
   the device comprises a high speed application, a high frequency application, or both;
   the data rate of the high speed application is higher than 1 Gbps; and
   the frequency of the high frequency application is higher than 1 GHz.

9. The copper clad laminate of claim 5, wherein the copper clad laminate has:
   a peel strength of 0.4 kN/m or more;
   a heat resistance at 260° C. for more than 30 seconds; and
   an insertion loss at 10 GHz of 2.5 dB/10 cm or less, or at 39 GHz of 8.0 dB/10 cm or less.

10. A printed circuit board comprising the copper clad laminate of claim 5.

11. A device comprising the printed circuit board of claim 10, wherein:
    the device comprises a high speed application, a high frequency application, or both;
    the data rate of the high speed application is higher than 1 Gbps; and
    the frequency of the high frequency application is higher than 1 GHz.

12. The composite of claim 1, wherein the non-copper metal elements include zinc, nickel, chromium, cobalt, molybdenum, tungsten, or combinations thereof.

13. The device of claim 8, wherein the device is selected from the group consisting of servers, routers, storage area networks, power amplifiers, transceiver modules, high speed data channels and mobile electronics.

14. The device of claim 11, wherein the device is selected from the group consisting of servers, routers, storage area networks, power amplifiers, transceiver modules, high speed data channels and mobile electronics.

* * * * *